United States Patent
Wang

(10) Patent No.: US 9,787,196 B2
(45) Date of Patent: Oct. 10, 2017

(54) FREQUENCY JITTERING CONTROL CIRCUIT AND THE METHOD THEREOF

(71) Applicant: Monolithic Power Systems, Inc., San Jose, CA (US)

(72) Inventor: Siran Wang, Hangzhou (CN)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 15/275,165

(22) Filed: Sep. 23, 2016

(65) Prior Publication Data

US 2017/0085185 A1    Mar. 23, 2017

(30) Foreign Application Priority Data

Sep. 23, 2015  (CN) .......................... 2015 1 0609747

(51) Int. Cl.
| | | |
|---|---|---|
| *H02M 3/335* | (2006.01) | |
| *H03K 7/08* | (2006.01) | |
| *G11C 27/02* | (2006.01) | |
| *H02M 1/08* | (2006.01) | |
| *H02M 1/44* | (2007.01) | |
| *H02M 1/00* | (2006.01) | |

(52) U.S. Cl.
CPC ....... *H02M 3/33507* (2013.01); *G11C 27/024* (2013.01); *H02M 1/08* (2013.01); *H02M 1/44* (2013.01); *H02M 3/335* (2013.01); *H03K 7/08* (2013.01); *H02M 2001/0009* (2013.01); *H02M 2001/0025* (2013.01)

(58) Field of Classification Search
CPC . H02M 3/33507; H02M 3/335; H02M 1/0025
USPC ......... 363/21.12, 21.13, 21.15, 21.16, 21.17, 363/21.18
See application file for complete search history.

(56) References Cited

U.S. PATENT DOCUMENTS

| | | | |
|---|---|---|---|
| 8,270,185 B2 | 9/2012 | Hu et al. | |
| 8,320,139 B2 | 11/2012 | Hu et al. | |
| 9,019,729 B2* | 4/2015 | Kleinpenning ... | H02M 3/33523 363/21.12 |
| 9,093,909 B2 | 7/2015 | Wang et al. | |
| 2014/0177289 A1* | 6/2014 | Chen ................ | H02M 3/33515 363/21.13 |
| 2016/0226383 A1* | 8/2016 | Hayakawa ........ | H02M 3/33523 |

OTHER PUBLICATIONS

U.S. Appl. No. 15/011,336, filed Jan. 29, 2016, Chengdu Monolithic Power Systems Co., Ltd.

* cited by examiner

*Primary Examiner* — Timothy J Dole
*Assistant Examiner* — Ishrat Jamali
(74) *Attorney, Agent, or Firm* — Perkins Coie LLP

(57) ABSTRACT

A control method of frequency jittering with a switching mode power supply, comprising: turning on and off a power switch of the switching mode power supply alternatively; updating a peak current signal of the switching mode power supply at a beginning of an on time of the power switch according to a length of a switching period before the beginning of the on time of the power switch, wherein the peak current signal varies as the length of the switching period changes.

20 Claims, 3 Drawing Sheets

FREQUENCY JITTERING CONTROL CIRCUIT AND THE METHOD THEREOF

CROSS-REFERENCE TO RELATED APPLICATIONS

This application claims priority to and the benefit of Chinese Patent Application No. 201510609747.1, filed on Sep. 23th, 2015, which is incorporated herein by reference in its entirety.

FIELD

The present invention relates generally to electronic circuits, and more particularly but not exclusively to frequency jittering control circuit and the method thereof.

BACKGROUND

Frequency jittering is commonly applied in switching mode power supplies to improve EMI (Electro Magnetic Interference). Conventional frequency jittering method is always used with switching mode power supplies with PWM (Pulse Width Modulation) control. The conventional frequency jittering method processes a clock signal of the switching mode power supply with PWM control to realize frequency jittering. However, in switching mode power supply without clock signal, novel frequency jittering method is needed. For example, in switching mode power supply with PFM (Pulse Frequency Modulation) control, there is not clock signal. But when an input voltage and an output voltage are fixed, the switching mode power supply with PFM control suffers from EMI too. Thus, Frequency jittering method are still needed in switching mode power supply with PFM control even if there is no clock signal As a result, there is a need for frequency jittering method used with switching mode circuit without clock signal.

SUMMARY

It is an object of the present invention to provide a frequency jittering control to the switching mode power supply with PFM control.

In accomplishing the above and other objects, there has been provided, in accordance with an embodiment of the present invention, a frequency jittering control circuit used with a switching mode power supply having a power switch, comprising: a peak current signal generating circuit, having an input terminal configured to receive an on trigger signal having a pulse indicative of a beginning of an on time of the power switch, and an output terminal configured to provide a peak current signal based on the on trigger signal; a peak comparator, having a first input terminal coupled to the output terminal of the peak current signal generating circuit to receive the peak current signal, a second input terminal configured to receive a current sense signal indicative of a current flowing through the power switch, and an output terminal configured to provide a current control signal based on the peak current signal and the current sense signal; and a logic circuit, having a first input terminal configured to receive the on trigger signal, a second input terminal coupled to the output terminal of the peak comparator to receive the current control signal, and an output terminal configured to provide a power control signal based on the on trigger signal and the current control signal, wherein the power control signal controls on and off of the power switch; wherein the peak current signal is updated at the beginning of the on time of the power switch, and a value of the peak current signal is determined by a length of a switching period before the beginning of the on time of the power switch.

In accomplishing the above and other objects, there has been provided, in accordance with an embodiment of the present invention, a switching mode power supply, comprising: a switching circuit having a power switch being turned on and off alternatively to convert an input voltage to an output voltage; a frequency jittering control circuit configured to provide a power control signal to control the on and off of the power switch, wherein the frequency jittering control circuit comprises: a peak current signal generating circuit having an input terminal configured to receive an on trigger signal having a pulse indicative of a beginning of an on time of the power switch, and an output terminal configured to provide a peak current signal based on the on trigger signal; a peak comparator having a first input terminal coupled to the output terminal of the peak current signal generating circuit to receive the peak current signal, a second input terminal configured to receive a current sense signal indicative of a current flowing through the power switch, and an output terminal configured to provide a current control signal based on the peak current signal and the current sense signal; and a logic circuit having a first input terminal configured to receive the on trigger signal, a second input terminal coupled to the output terminal of the peak comparator to receive the current control signal, and an output terminal configured to provide a power control signal based on the on trigger signal and the current control signal, wherein the power control signal controls on and off of the power switch; wherein the peak current signal is updated at the beginning of the on time of the power switch, and a value of the peak current signal is determined by a length of a switching period before the beginning of the on time of the power switch.

In accomplishing the above and other objects, there has been provided, in accordance with an embodiment of the present invention, a control method of frequency jittering with a switching mode power supply, comprising: turning on and off a power switch of the switching mode power supply alternatively; updating a peak current signal of the switching mode power supply at a beginning of an on time of the power switch according to a length of a switching period before the beginning of the on time of the power switch, wherein the peak current signal: has a first voltage value when the length of the switching period is shorter than a first preset value; has a second voltage value when the length of the switching period is longer than a second preset value; and has a third voltage value decreasing as increasing of the length of the switching period when the length of the switching period is between a first preset value and a second preset value; wherein the first preset value is smaller than the second preset value, and the first voltage value is larger than the second voltage value.

In one embodiment, the value of the peak current signal has: a first voltage value when the length of the switching period before the beginning of the on time of the power switch is shorter than a first preset value; a second voltage value when the length of the switching period before the beginning of the on time of the power switch is longer than a second preset value; and a third voltage value decreasing as increasing of the length of the switching period before the beginning of the on time of the power switch, when the length of the switching period is between the first preset value and the second preset value; wherein the first preset value is smaller than the second preset value, and the first voltage value is larger than the second voltage value.

The use of the same reference label in different drawings indicates the same or like components.

DETAILED DESCRIPTION

In the present invention, numerous specific details are provided, such as examples of circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
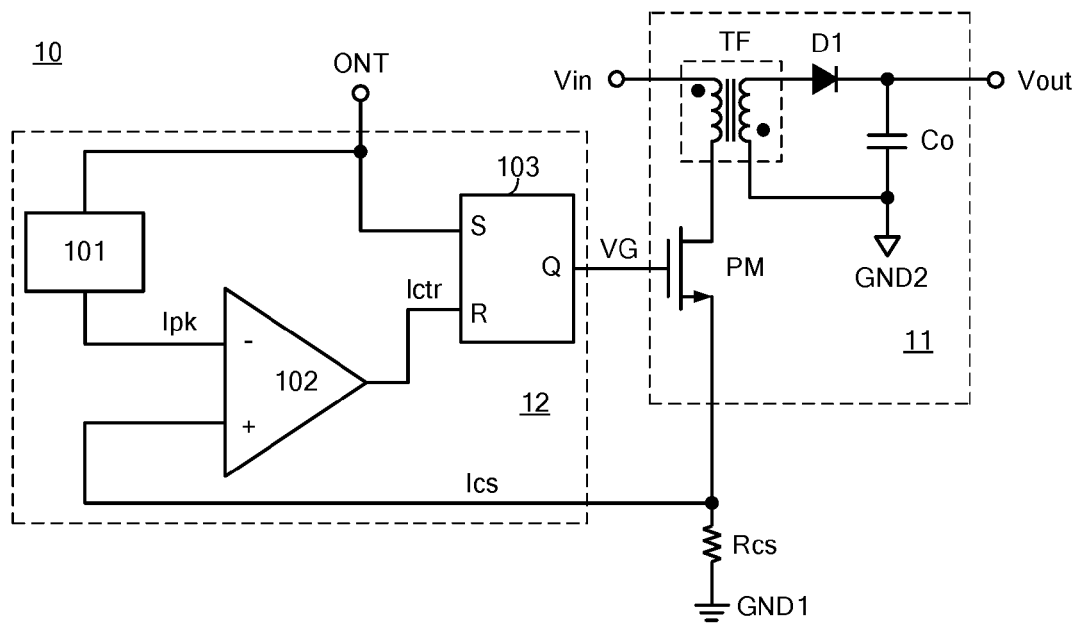
FIG. 1 schematically shows a switching mode power supply 10 in accordance with an embodiment of the present invention.

FIG. 1 schematically shows a switching mode power supply 10 in accordance with an embodiment of the present invention. As shown in FIG. 1, the switching mode power supply 10 comprises a switching circuit 11 and a frequency jittering control circuit 12. The switching circuit 11 comprises: a transformer TF, having a primary side configured to receive an input voltage Vin and a secondary side configured to provide an output voltage Vout; a primary switch PM coupled between the transformer TF and a primary ground reference GND1; a secondary switch D1 coupled between the transformer TF and the output voltage Vout; an output capacitor Co coupled between the output voltage Vout and a secondary ground reference GND2. The primary switch PM is turned on and off alternatively by the power control signal VG provided by the frequency jittering control circuit 12, to convert the input voltage Vin into the output voltage. In one embodiment, the switching circuit 11 further comprises a current sense resistor Rcs coupled between the primary switch PM and the primary ground reference GND1. When the primary power switch PM is on, a current from the input voltage Vin flows through the primary power switch PM and the current sense resistor Rcs, so that to create a voltage drop, i.e., a current sense signal Ics, across the current sense resistor Rcs. The current sense signal Ics indicates a current flowing through the transformer TF or the primary power switch PM, and is related to an output current of the switching mode power supply. Multiple circuits and methods known to persons of ordinary skill in the art may be applied to generate the current sense signal Ics, and are not described here for brevity.

The frequency jittering control circuit 12 comprises: a peak current signal generating circuit 101, having an input terminal configured to receive an on trigger signal ONT having a pulse indicative of a beginning of an on time of the primary power switch PM, and an output terminal configured to provide a peak current signal Ipk based on the on trigger signal ONT; a peak comparator 102, having a first input terminal coupled to the output terminal of the peak current signal generating circuit 101 to receive the peak current signal Ipk, a second input terminal configured to receive the current sense signal Ics, and an output terminal configured to provide a current control signal Ictr based on the peak current signal Ipk and the current sense signal Ics; a logic circuit 103, having a first input terminal configured to receive the on trigger signal ONT, a second input terminal coupled to the output terminal of the peak comparator 102 to receive the current control signal Ictr, and an output terminal configured to provide a power control signal VG based on the on trigger signal ONT and the current control signal Ictr, wherein the power control signal VG controls on and off of the power switch PM.

The peak current signal Ipk is updated at the beginning of the on time of the power switch PM, and a value of the peak current signal Ipk is determined by a length of a switching period Ts before the beginning of the on time of the power switch PM. The switching period Ts is defined as a time period between the adjacent two pulses of the on trigger signal ONT, i.e., a time period from a moment the power switch PM is turned on to the next moment the power switch PM is turned on.

In one embodiment, the logic circuit 103 comprises a first RS flip-flop 103, having a set terminal "S" configured to receive the on trigger signal ONT, a reset terminal "R" coupled to the output terminal of the peak comparator 102 to receive the current control signal Ictr, and an output terminal "Q" configured to provide the power control signal VG.

Figure 3:
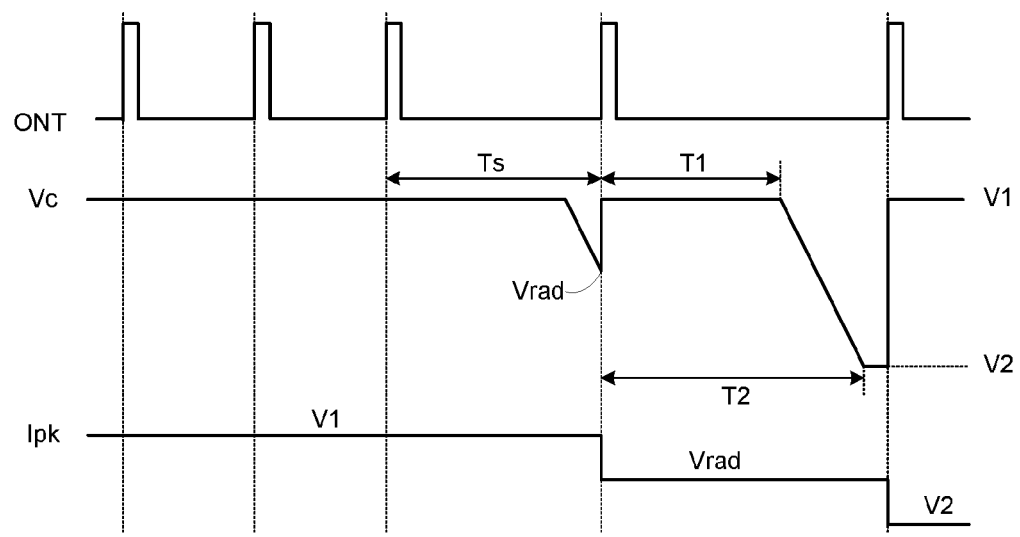
FIG. 3 shows waveforms of the peak current signal Ipk, the on trigger signal ONT and the voltage Vc across the capacitor C1.

When the first RS flip-flop 103 is set by the on trigger signal ONT, the power control signal VG turns on the primary power switch PM; when the first RS flip-flop 103 is reset by the current control signal Ictr, the power control signal VG turns off the primary power switch PM. The on trigger signal ONT has the pulse indicative of the beginning of the on time of the power switch PM as shown in FIG. 3, and may be generated with different methods. For example, the on trigger signal ONT may be generated by comparison of the output voltage Vout of the switching mode power supply with a reference signal, or the on trigger signal ONT may be generated by a constant off time circuit of a switching mode power supply with constant off time control, i.e., the first RS flip-flop 103 is set by the on trigger signal ONT to turn on the primary power switch PM after a constant off time period.

The switching circuit 11 in FIG. 1 comprises a flyback converter. Persons of ordinary skill in the art should know that the switching circuit 11 of the present invention may comprise other types of converters, e.g., buck converter, boost converter, buck-boost converter and so on.

Figure 2:
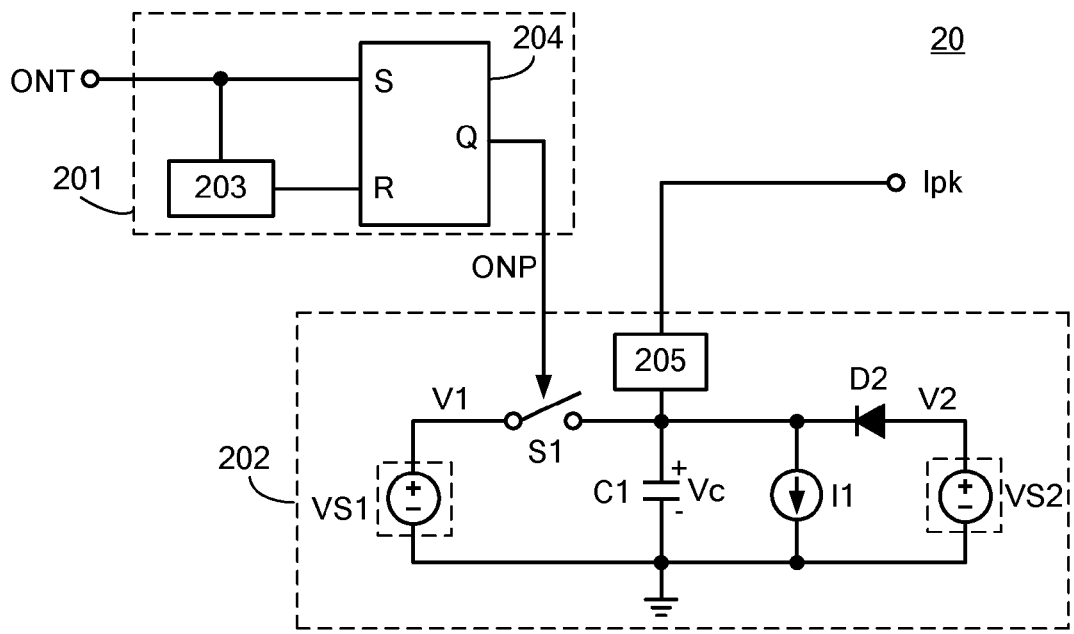
FIG. 2 schematically shows a peak current signal generating circuit 20 in accordance with an embodiment of the present invention.

FIG. 2 schematically shows a peak current signal generating circuit 20 in accordance with an embodiment of the present invention. As shown in FIG. 2, the peak current signal generating circuit 20 comprises: a pulse width adjusting circuit 201, having an input terminal configured to receive the on trigger signal ONT, and an output terminal configured to provide a pulse width signal ONP based on the on trigger signal ONT; a peak value control circuit 202, having an input terminal coupled to the output terminal of the pulse width adjusting circuit 201 to receive the pulse width signal ONP, and an output terminal configured to provide the peak current signal Ipk based on the pulse width signal ONP.

In one embodiment, the pulse width adjusting circuit 201 comprises: a delay circuit 203, having an input terminal configured to receive the on trigger signal ONT, and an output terminal configured to provide a delay signal ONT_D having a delay time of the first preset period of Td compared to the on trigger signal ONT; and a second RS flip-flop 204, having a set terminal "S" configured to receive the on trigger signal ONT, a reset terminal "R" coupled to the delay circuit 203 to receive the delay signal ONT_D, and an output terminal "Q" configured to provide the pulse width signal ONP based on the on trigger signal ONT and the delay signal ONT_D. As a result, the pulse width signal ONP keeps in a voltage level for a first preset time period T1 from a pulse of the on trigger signal ONT. Any circuit which converts the on trigger signal ONT into a signal with constant pulse width of the first preset time period T1 may be adopted in the present invention.

In one embodiment, the peak value control circuit 202 comprises: a capacitor C1, having a first terminal, and a second terminal coupled to the ground reference; a first voltage source VS1 coupled in parallel to the capacitor C1 by a first switch S1, wherein a voltage Vc across the capacitor C1 is clamped to a first voltage value V1 provided by the first voltage source VS1 when the first switch S1 is turned on; a current source I1 coupled in parallel to the capacitor C1; a second voltage source VS2 coupled in parallel to the capacitor C1 by a second switch D2, wherein the voltage Vc across the capacitor C1 is clamped to the second voltage value V2 by the second voltage source VS2 when the second switch D2 is turned on; and a sample and hold circuit 205 having an input terminal coupled to the first terminal of the capacitor C1, and an output terminal configured to provide the peak current signal Ipk; wherein, the sample and hold circuit 205 samples and holds the voltage Vc across the capacitor C1 when the primary power switch PM is turned on, i.e., the peak current signal Ipk is updated to the voltage Vc across the capacitor C1 at every beginning of the on time of the primary power switch PM.

The voltage Vc across the capacitor C1 keeps the first voltage value V1 for a first preset time period T1 from the moment the power switch PM is turned on. After the first preset time period T1, the first switch S1 is turned off, and the capacitor C1 is discharged by the current source I1, so that the voltage Vc decreases. When the voltage Vc decreases to the second voltage value V2 after a second preset time period T2 from the moment the power switch PM is on, the second switch D2 is turned on, and the voltage Vc is clamped to the second voltage value V2 provided by the second voltage source VS2. The first time period T1 is determined by the pulse width of the pulse width signal ONP, and the second time period T2 is determined by the first time period T1, the first voltage value V1, the second voltage value V2, a capacitance of the capacitor C1, and a current provided by the current source I1, which is $T2=T1+(V1-V2)\times C1/I1$. Persons of ordinary skill in the art may adjust the time period T2 by changing the first voltage value V1, the second voltage value V2, the capacitance of the capacitor C1 or the discharge current controlled by the current source I1.

In one embodiment, the second switch D2 comprises a diode. Persons of ordinary skill in the art should know that the diode D2 is considered to be ideal here. In real application, the influence of the forward voltage of the diode D2 may be eliminated by adjusting the second voltage value V2 provided by the second voltage source VS2.

FIG. 3 shows waveforms of the peak current signal Ipk, the on trigger signal ONT and the voltage Vc across the capacitor C1. As shown in FIG. 3, the peak current signal Ipk has: a first voltage value V1 when the length of the switching period Ts before the beginning of the on time of the power switch PM is shorter than the first time period T1; a second voltage value V2 when the length of the switching period Ts before the beginning of the on time of the power switch PM is longer than the second time period T2; and a third voltage value Vrad decreasing as increasing of the length of the switching period Ts before the beginning of the on time of the power switch PM, when the length of the switching period Ts is between the first time period T1 and the second time period T2; wherein the first time period T1 is smaller than the second time period T2, and the first voltage value V1 is larger than the second voltage value V2.

In one embodiment, the on trigger signal ONT has a pulse with a rising edge corresponding to the turning on moment of the primary power switch PM.

In one embodiment, the sample and hold circuit 205 samples and holds the voltage Vc across the capacitor C1 at the rising edge of the on trigger signal ONT until the next rising edge as shown in FIG. 3.

In one embodiment, the first voltage value V1 provided by the first voltage source VS1 is constant, and the second voltage value V2 provided by the second voltage source VS2 is constant too.

Figure 4:
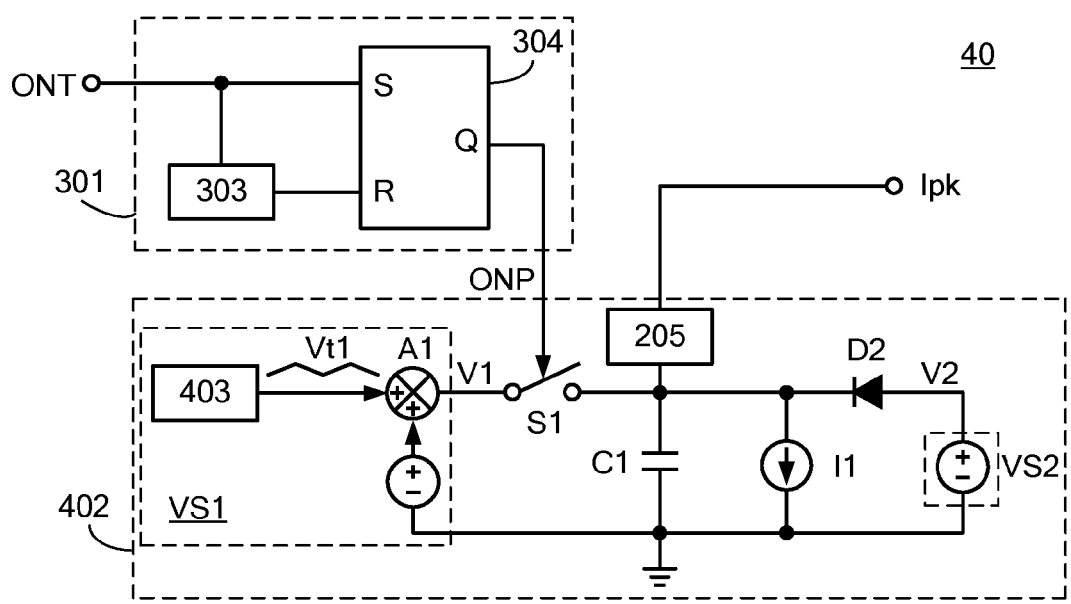
FIG. 4 schematically shows a peak current signal generating circuit 40 in accordance with an embodiment of the present invention.

FIG. 4 schematically shows a peak current signal generating circuit 40 in accordance with an embodiment of the present invention. Compared with the peak current signal generating circuit 20 in FIG. 2, the first voltage value V1 is varying. In other words, the first voltage value V1 is a value of a constant voltage value summed by a varying voltage value Vt1. Thus, even if a switching frequency of the switching circuit is very high, i.e., the switching period is shorter than the first time period T1, the peak current signal Ipk is varying. The switching frequency is defined as a reciprocal of the switching period Ts.

In one embodiment, Vt1 is controlled to be within 10% of the first voltage value V1.

In one embodiment, a period of the varying voltage value Vt1 is longer than the first time period T1.

Figure 5:
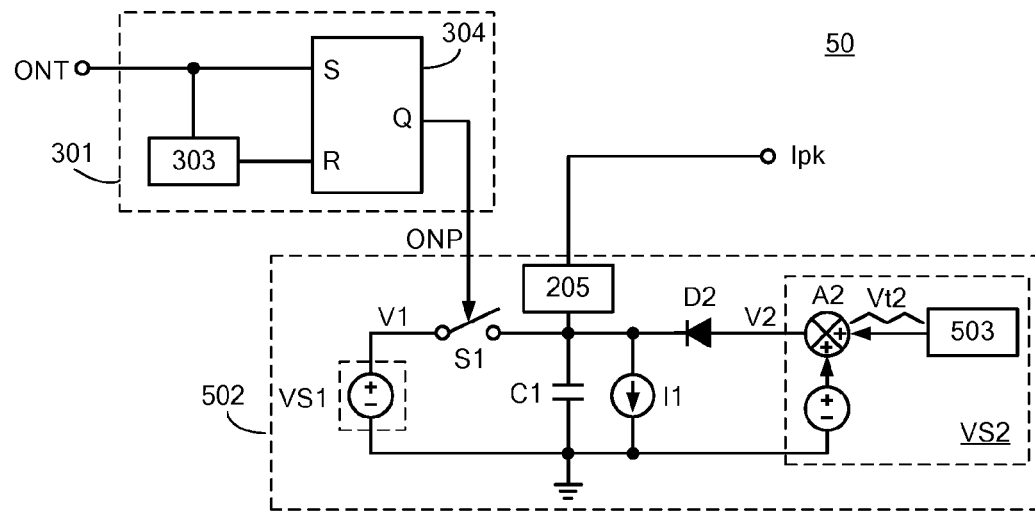
FIG. 5 schematically shows a peak current signal generating circuit 50 in accordance with an embodiment of the present invention.

FIG. 5 schematically shows a peak current signal generating circuit 50 in accordance with an embodiment of the present invention. Compared with the peak current signal generating circuit 20 in FIG. 2, the second voltage value V2 is varying. In other words, the second voltage value V2 is a value of a constant voltage value summed by a varying voltage value Vt2. Thus, even if the switching frequency of the switching circuit is very high, i.e., the switching period is longer than the second time period T2, the peak current signal Ipk is varying.

In one embodiment, Vt2 is controlled to be within 10% of the second voltage value V2.

In one embodiment, a period of the varying voltage value Vt2 is longer than the second time period T2.

In one embodiment, both of the first voltage value V1 and the second voltage value V2 are varying.

Persons of ordinary skill in the art should know that the peak current signal generating circuit provided in the present invention may be used with any switching mode power supply with peak current control, including switching mode power supply with PFM control.

Figure 6:
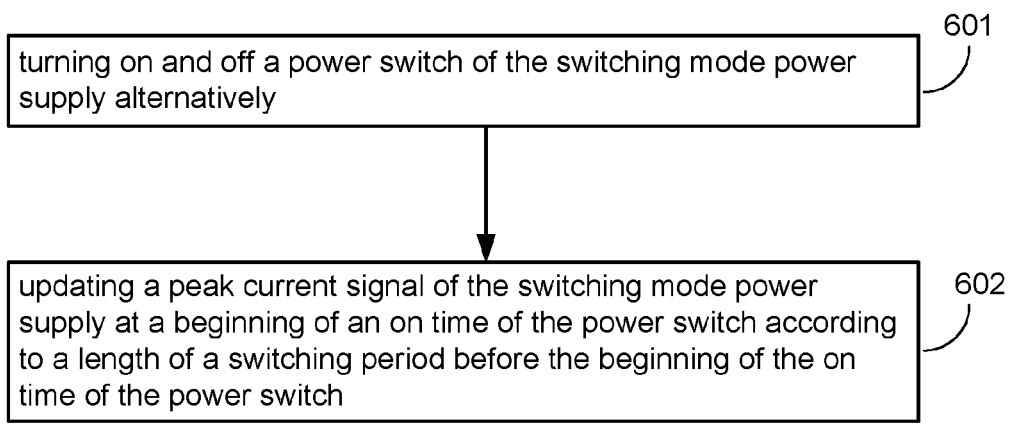
FIG. 6 shows a control method 60 of frequency jittering with a switching mode power supply in accordance with an embodiment of the present invention.

FIG. 6 shows a control method 60 of frequency jittering with a switching mode power supply in accordance with an embodiment of the present invention. The control method 60 may be applied in switching mode power supply with peak current control. The switching mode power supply has switching cycles in which a primary power switch and a secondary power switch are turned on and off alternatively. The control method 60 comprises: step 601, turning on and off a power switch of the switching mode power supply alternatively; step 602, updating a peak current signal of the switching mode power supply at a beginning of an on time of the power switch according to a length of a switching period before the beginning of the on time of the power switch wherein the peak current signal has: a first voltage value when the length of the switching period is shorter than a first preset value; a second voltage value when the length of the switching period is longer than a second preset value; and a third voltage value decreasing as increasing of the length of the switching period when the length of the switching period is between a first preset value and a second preset value; wherein the first preset value is smaller than the second preset value, and the first voltage value is larger than the second voltage value.

In one embodiment, the first voltage value and the second voltage value are constant.

In one embodiment, the first voltage value is varying, and the second voltage value is constant.

In one embodiment, the first voltage value and the second voltage value are both varying.

In one embodiment, the first voltage value is constant, and the second voltage value is varying.

In one embodiment, a varying voltage value of the first voltage value V1 or a varying voltage value of the second voltage value V2 has a triangle waveform.

In one embodiment, a varying voltage value of the first voltage value V1 or a varying voltage value of the second voltage value V2 has a sine waveform.

In one embodiment, the amplitude of the variation of the first voltage value V1 is within 10% of the first voltage value V1.

In one embodiment, the amplitude of the variation of the second voltage value V2 is within 10 of the second voltage value V2.

The present invention provides a frequency jittering technique by varying a peak current signal of the switching mode power supply with peak current control. Thus, EMI of the switching mode power supply could be eliminated. The frequency jittering control circuit provided by the present invention has simple structure and may be used with switching mode power supply with peak current control, e.g., PWM mode controlled SMPS and PFM mode controlled SMPS.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A frequency jittering control circuit used with a switching mode power supply having a power switch, comprising:
    a peak current signal generating circuit, having an input terminal configured to receive an on trigger signal having a pulse indicative of a beginning of an on time of the power switch, and an output terminal configured to provide a peak current signal based on the on trigger signal;
    a peak comparator, having a first input terminal coupled to the output terminal of the peak current signal generating circuit to receive the peak current signal, a second input terminal configured to receive a current sense signal indicative of a current flowing through the power switch, and an output terminal configured to provide a current control signal based on the peak current signal and the current sense signal; and
    a logic circuit, having a first input terminal configured to receive the on trigger signal, a second input terminal coupled to the output terminal of the peak comparator to receive the current control signal, and an output terminal configured to provide a power control signal based on the on trigger signal and the current control signal, wherein the power control signal controls on and off of the power switch; wherein
    the peak current signal is updated at the beginning of the on time of the power switch, and a value of the peak current signal is determined by a length of a switching period before the beginning of the on time of the power switch.

2. The frequency jittering control circuit of claim 1, wherein the value of the peak current signal has:
    a first voltage value when the length of the switching period before the beginning of the on time of the power switch is shorter than a first preset value;
    a second voltage value when the length of the switching period before the beginning of the on time of the power switch is longer than a second preset value; and
    a third voltage value decreasing as increasing of the length of the switching period before the beginning of the on time of the power switch, when the length of the switching period is between the first preset value and the second preset value; wherein
    the first preset value is smaller than the second preset value, and the first voltage value is larger than the second voltage value.

3. The frequency jittering control circuit of claim 1, wherein the peak current signal generating circuit comprises:
    a pulse width adjusting circuit, having an input terminal configured to receive the on trigger signal, and an output terminal configured to provide a pulse width signal based on the on trigger signal; and
    a peak value control circuit, having an input terminal coupled to the output terminal of the pulse width adjusting circuit to receive the pulse width signal, and an output terminal configured to provide the peak current signal based on the pulse width signal.

4. The frequency jittering control circuit of claim 3, wherein the pulse width signal has a pulse started from the pulse of the on trigger signal and ended after a preset time period.

5. The frequency jittering control circuit of claim 3, wherein the peak value control circuit comprises:
    a capacitor having a first terminal and a second terminal, wherein the second terminal is coupled to a ground reference;
    a first voltage source, coupled in parallel to the capacitor by a sample switch, wherein a voltage across the capacitor is clamped to the first voltage value provided by the first voltage source when the sample switch is on;
    a current source, coupled in parallel with the capacitor;

a second voltage source, coupled in parallel to the capacitor by a diode, wherein the voltage across the capacitor is clamped to the second voltage value provided by the second voltage source when the diode is on; and a sample and hold circuit, having an input terminal coupled to the first terminal of the capacitor, and an output configured to provide the peak current signal; wherein the sample and hold circuit samples and holds the voltage across the capacitor at the beginning of the on time of the power switch.

6. The frequency jittering control circuit of claim 1, wherein the first voltage value and the second voltage value are constant.

7. The frequency jittering control circuit of claim 1, wherein the first voltage value is varying, and the second voltage value is constant.

8. The frequency jittering control circuit of claim 1, wherein the first voltage value and the second voltage value are both varying.

9. The frequency jittering control circuit of claim 1, wherein the first voltage value is constant, and the second voltage value is varying.

10. A switching mode power supply, comprising:
a switching circuit having a power switch being turned on and off alternatively to convert an input voltage to an output voltage;
a frequency jittering control circuit configured to provide a power control signal to control the on and off of the power switch, wherein the frequency jittering control circuit comprises:
a peak current signal generating circuit having an input terminal configured to receive an on trigger signal having a pulse indicative of a beginning of an on time of the power switch, and an output terminal configured to provide a peak current signal based on the on trigger signal;
a peak comparator having a first input terminal coupled to the output terminal of the peak current signal generating circuit to receive the peak current signal, a second input terminal configured to receive a current sense signal indicative of a current flowing through the power switch, and an output terminal configured to provide a current control signal based on the peak current signal and the current sense signal; and
a logic circuit having a first input terminal configured to receive the on trigger signal, a second input terminal coupled to the output terminal of the peak comparator to receive the current control signal, and an output terminal configured to provide a power control signal based on the on trigger signal and the current control signal, wherein the power control signal controls on and off of the power switch;
wherein the peak current signal is updated at the beginning of the on time of the power switch, and a value of the peak current signal is determined by a length of a switching period before the beginning of the on time of the power switch.

11. The switching mode power supply of claim 10, wherein the value of the peak current signal has:
a first voltage value when the length of the switching period before the beginning of the on time of the power switch is shorter than a first preset value;
a second voltage value when the length of the switching period before the beginning of the on time of the power switch is longer than a second preset value; and
a third voltage value decreasing as increasing of the length of the switching period before the beginning of the on time of the power switch, when the length of the switching period is between the first preset value and the second preset value;
wherein the first preset value is smaller than the second preset value, and the first voltage value is larger than the second voltage value.

12. The switching mode power supply of claim 10, wherein the peak current signal generating circuit comprises:
a pulse width adjusting circuit having an input terminal configured to receive the on trigger signal, and an output terminal configured to provide a pulse width signal based on the on trigger signal; and
a peak value control circuit having an input terminal coupled to the output terminal of the pulse width adjusting circuit to receive the pulse width signal, and an output terminal configured to provide the peak current signal based on the pulse width signal.

13. The switching mode power supply of claim 12, wherein the pulse width signal has a pulse started from the pulse of the on trigger signal and ended after a preset time period.

14. The switching mode power supply of claim 10, wherein the first voltage value and the second voltage value are constant.

15. The switching mode power supply of claim 10, wherein the first voltage value is varying, and the second voltage value is constant.

16. The switching mode power supply of claim 10, wherein the first voltage value and the second voltage value are both varying.

17. The switching mode power supply of claim 10, wherein the first voltage value is constant, and the second voltage value is varying.

18. A control method of frequency jittering with a switching mode power supply, comprising:
turning on and off a power switch of the switching mode power supply alternatively;
updating a peak current signal of the switching mode power supply at a beginning of an on time of the power switch according to a length of a switching period before the beginning of the on time of the power switch, wherein the peak current signal:
has a first voltage value when the length of the switching period is shorter than a first preset value;
has a second voltage value when the length of the switching period is longer than a second preset value; and
has a third voltage value decreasing as increasing of the length of the switching period when the length of the switching period is between a first preset value and a second preset value;
wherein the first preset value is smaller than the second preset value, and the first voltage value is larger than the second voltage value.

19. The control method of frequency jittering with a switching mode power supply of claim 18, wherein the first voltage value and the second voltage value are constant.

20. The control method of frequency jittering with a switching mode power supply of claim 18, wherein the first voltage value is varying, and the second voltage value is constant.

* * * * *